(12) United States Patent
Funaba et al.

(10) Patent No.: US 6,937,494 B2
(45) Date of Patent: Aug. 30, 2005

(54) MEMORY MODULE, MEMORY CHIP, AND MEMORY SYSTEM

(75) Inventors: Seiji Funaba, Tokyo (JP); Yoji Nishio, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 0 days.

(21) Appl. No.: 10/699,628

(22) Filed: Oct. 31, 2003

(65) Prior Publication Data

US 2005/0105318 A1    May 19, 2005

(30) Foreign Application Priority Data

Oct. 31, 2002    (JP) .............................. 2002-318271

(51) Int. Cl.[7] ............................................... G11C 5/06
(52) U.S. Cl. .............................. 365/63; 365/51; 365/52
(58) Field of Search .............................. 365/63, 51, 52, 365/230.03, 233

(56) References Cited

U.S. PATENT DOCUMENTS 6,594,170 B2 *    7/2003    Kudou et al. .................. 365/51

FOREIGN PATENT DOCUMENTS

JP            2003-85121        3/2003

* cited by examiner

*Primary Examiner*—David Lam
(74) *Attorney, Agent, or Firm*—Katten Muchin Rosenman LLP

(57) ABSTRACT

A memory module includes at least one CAR and a plurality of DRAMs provided so as to be close and adjacent to one another on one face and the other face of a module substrate. The DRAMs are divided into a plurality of memory groups. Memory groups adjacent to each other of these memory groups are paired with each other. One of this pair is a 1-ranked memory group and the other is a 2-ranked memory group. This pair of the memory groups is connected to the CAR via short wiring with a T-branch structure having a short stub. One of the pair of the memory groups on the signal-reception side functions as an open end. Active termination is performed by a termination resistor of the other of the pair of the memory groups on the signal-non-reception side. Subsequently, signal reflections can be reduced.

14 Claims, 18 Drawing Sheets

MEMORY MODULE, MEMORY CHIP, AND MEMORY SYSTEM

BACKGROUND OF THE INVENTION

1. Field of the Invention

The present invention relates to a memory module including at least one command-address signal register and a plurality of memory chips. Each of the memory chips has a command-address signal terminal with an active-termination circuit. The memory chips are divided into a plurality of memory groups of even-numbered ranks. The command-address signal register is connected to the plurality of memory chips through internal wiring. The present invention further relates to a memory system using the above-described memory module and particularly relates to a memory module that can reduce signal reflections in a stub with a T-branch structure and operate with high speed and a memory system using this memory module.

2. Description of the Related Art

FIG. 1 illustrates an example known memory module 1 including a command-address register (CAR) 3 and a plurality of dynamic random access memories (DRAM) 2 as memory chips. This drawing illustrates the topology of command-address (CA) wiring of the memory module 1. The DRAMs 2 of this memory module 1 are double-data-rate synchronous (DDR-S) DRAMs.

In the memory module 1, the DRAMs 2 are divided into two groups. One of the two groups includes four DRAMs 2 on one surface of a package substrate and four DRAMs 2 on the other surface thereof. The other of the two groups includes five DRAMs 2 on one surface of the package substrate and five DRAMs 2 on the other surface thereof. These two groups of DRAMs 2 and the CAR 3 are connected to each other through the CA wiring with a T-branch structure.

The above-described topology is provided for reducing the length of the CA wiring so as to reduce the area on which the CA wiring is provided. According to this configuration, however, the length of a stub increases. Subsequently, the time constant of signal reflections becomes large. Therefore waveforms obtained where a high-speed signal is transmitted through this wiring are significantly distorted by multiple reflections, as shown in FIG. 2.

The above-described known memory module has a problem that the waveforms thereof are significantly distorted due to a high-speed signal.

The problem is caused by the configuration of the memory module. That is to say, the DRAMs functioning as memory chips are divided into two groups and these two groups are connected to each other via the wiring with a T-branch structure. Since the length of the stub increases, the time constant of signal reflections increases and the distortion of waveforms becomes significant.

Such related technique is disclosed in, for example, Japanese Patent Application No. JP 2001-270518.

SUMMARY OF THE INVENTION

Accordingly, it is an object of the present invention to provide a memory module, a plurality of memory chips used therefor, and a memory system using the memory module and the plurality of memory chips so as to solve the above-described problem and reduce the waveform distortion due to a high-speed signal.

A memory module according to one aspect of the present invention comprises a module substrate, at least one command-address signal register, a plurality of memory chips provided on a top face and under face of the module substrate, each of the plurality of memory chips having a command-address signal terminal with an active-termination circuit, and command-address signal wiring. The command-address signal register is internally wired and connected to the plurality of memory chips.

The plurality of memory chips is divided so as to form at least one 1-ranked memory group including two or three memory chips that are provided on one face and the other face of the module substrate and near and adjacent to each other and at least one 2-ranked memory group including two or three memory chips that are provided on one face and the other face of the module substrate and near and adjacent to each other. The 1-ranked memory group is paired with the 2-ranked memory group adjacent thereto so that this pair of memory groups has four or five memory chips. This pair of memory groups is accessible at the same time. The command-address signal wiring has a T-branch structure and is used for connecting the command-address signal register to the pair of memory groups corresponding thereto. When access is made, one of the pair of memory groups is used during the access and the other is not used. The command-address signal terminals of the memory chips of the memory group that is not used during the access are actively terminated. That is to say, the command-address signal terminals of the memory chips of either the 1-ranked memory group or the 2-ranked memory group are actively terminated. The memory module has other signal wiring with the same structure as that of this command-address signal wiring.

According to the topology of the above-described signal wiring with the T-branch structure, memory chips close and/or adjacent to each other on one face or both faces of the module substrate are paired with each other. Therefore, the length of a stub decreases. Active termination is performed in the memory chips of a memory group on the signal-non-reception side, the memory group being one of the pair of memory groups connected to each other via the command-address signal wiring with the T-branch structure. Therefore, the wiring of the memory chips of a memory group on the signal-reception side, the memory group being the other of the pair of memory groups, functions as an open end. Therefore, if signal reflections occur at the open end on the signal-reception side, the time constant thereof is small. Subsequently, the waveforms are prevented from being significantly distorted. Conversely, moderate signal reflections achieve fine waveforms with sharp rise and fall.

Preferably, the above-described memory module further comprises data signal wiring with a T-branch structure for connecting one of the pair of memory groups to the other. Each of the plurality of memory chips may further have a data signal terminal. The data-signal terminals of the memory chips of the memory group that is not used during the access may be actively terminated.

Preferably, the memory module further comprises command-address active-termination control signal wiring connected to a module terminal corresponding to any of the memory groups.

Preferably, the memory module further comprises clock-signal wiring with a T-branch structure. Each of the plurality of memory chips may further have a clock signal terminal. An even-number of the command-address signal registers may be provided so as to form at least two groups. The clock signal wiring may be connected to the command-address signal registers and the memory chips so as to connect the at least two groups of command-address signal registers to each other and the pair of memory groups to each other. The clock-signal terminals of the memory chips of one of the pair of memory groups may be actively terminated.

Preferably, each memory group of at least one of the pairs of memory groups adjacent and connected to each other so as to form a T-branch structure has two stacked memory chips on one face of the module substrate and one memory chip on the other face of the module substrate. The command-address signal terminal of the memory chip on the other face may be actively terminated.

Preferably, four pairs of the memory groups with ECC (error checking and correcting) capability are provided. These four pairs of the memory groups may include six memory groups. Each of the six memory groups may have one memory chip on one face of the module substrate and another memory chip on the other face thereof. These four pairs of the memory groups may further include two memory groups. Each of the two memory groups may have two memory chips stacked on each other on one face of the module substrate and another memory chip on the other face thereof.

Preferably, the stacked memory chips include a single memory chip with a first pad provided on one face of a printed circuit board and another single memory chip with a second pad provided on the other face thereof. The command-address signal wiring may be connected to both the first and second pads through a single wire and the data-signal wiring may be connected to one of the first and second pads through another single wire. A signal line of the stacked memory chips may be sandwiched between a power layer and a ground layer so as to form a strip line.

Preferably, the memory module further comprises clock-signal wiring with a T-branch structure for connecting one of the memory groups paired with each other to the other. Memory chips of one of the pair of memory groups may be terminated.

Preferably, each of the plurality of memory chips further has an active-termination circuit for a command-address active-termination control signal, a circuit for latching the command-address active-termination control signal, and a circuit for turning at least part of the active-termination circuit when the command-address active-termination control signal is latched during the active-termination circuit is turned on.

A memory system according to another aspect of the present invention comprises a mother board, first and second memory modules that have been described above on the mother board, and a memory controller connected to a plurality of memory chips mounted on the first and second memory modules so as to control memory capability. A signal wirings between each of the memory modules and the memory controller may be independently connected therebetween.

Preferably, the first memory module is provided at a first distance from the memory controller and the second memory module is provided at a second distance longer than the first distance from the memory controller. Signal wiring from the first memory module to the memory controller may be formed as internal-layer wiring and signal wiring from the second memory module to the memory controller may be formed as surface-layer wiring.

A memory system according to another aspect of the present invention comprises a mother board, first and second memory modules that have been described above on the mother board, and a memory controller connected to a plurality of memory chips mounted on the first and second memory modules so as to control memory capability. Among signal wirings between each of the memory modules and the memory controller, at least one of the command-address signal and the clock signal may be connected through wiring with a T-branch structure.

The configuration of the memory module of the present invention allows for reducing the waveform distortion during writing and/or reading a high-speed signal and achieving memory capability with reliability.

DESCRIPTION OF THE PREFERRED EMBODIMENTS

Embodiments of the present invention will now be described with reference to the attached drawings. The drawings are simplified for the sake of understanding so as to show main elements of the present invention.

Figure 1:
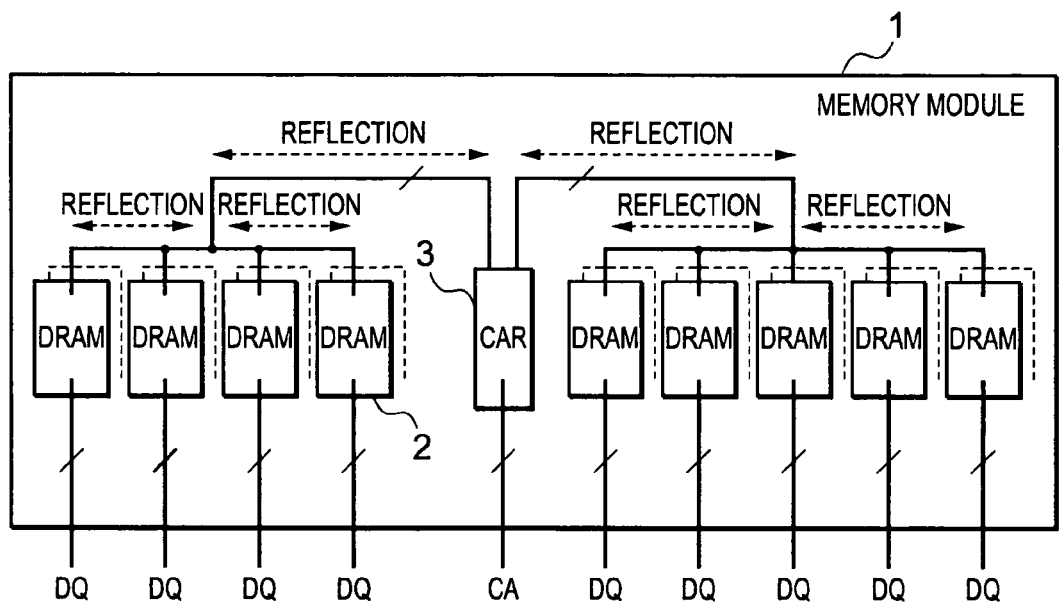
FIG. 1 illustrates example block wiring used for a known memory module.
Figure 2:
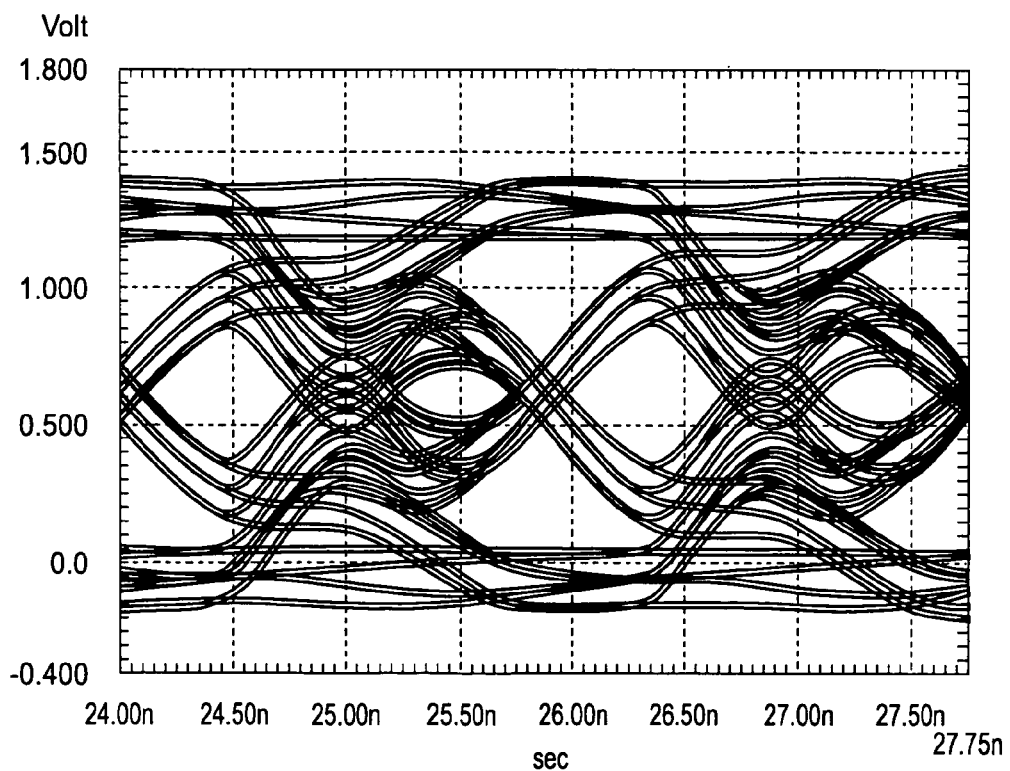
FIG. 2 illustrates example simulation waveforms obtained where the known memory module shown in FIG. 1 is used.
Figure 3:
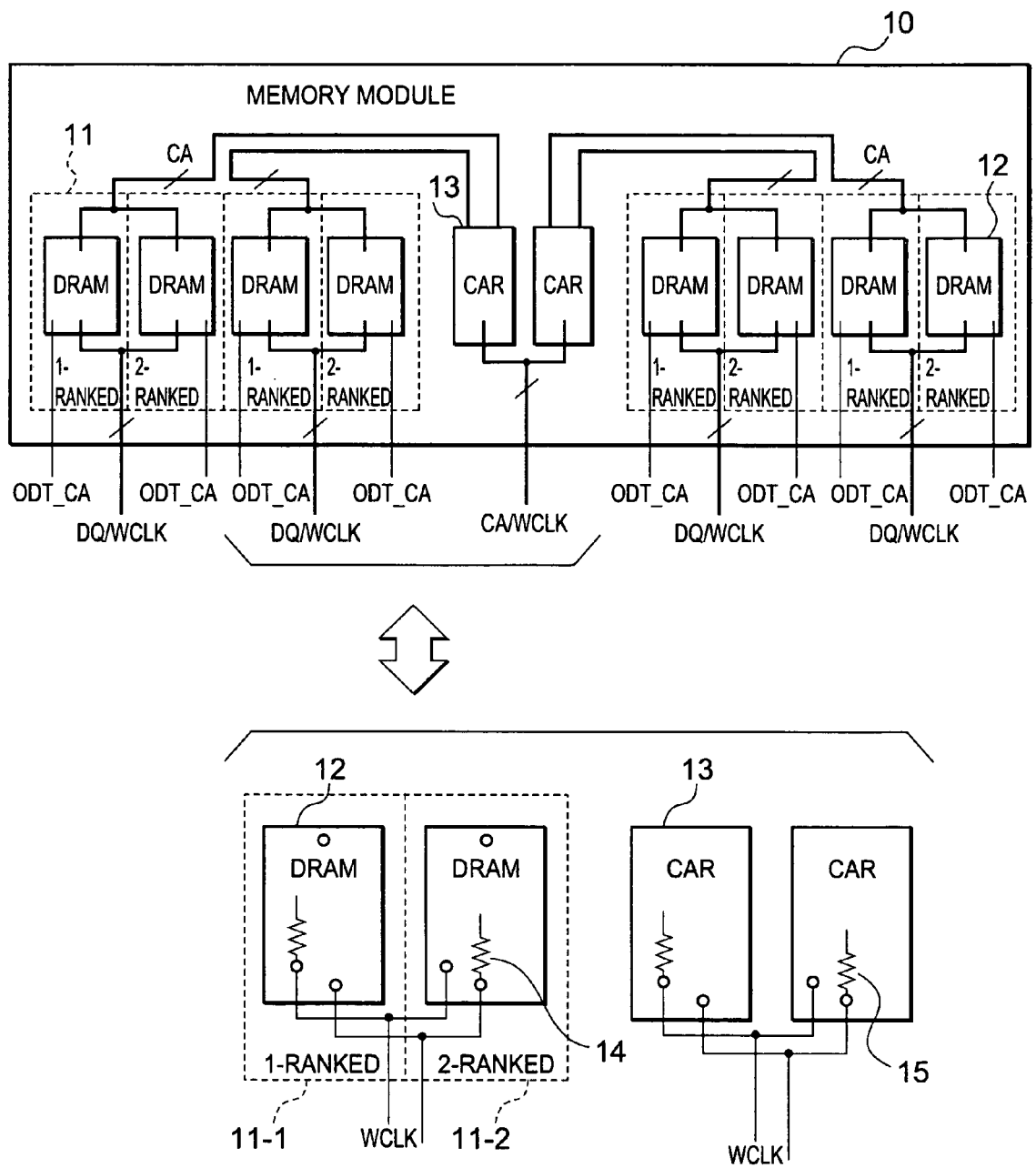
FIG. 3 illustrates an example configuration and example block wiring of a memory module according to the present invention.

FIG. 3 is a block wiring diagram illustrating a first embodiment of the present invention. As shown in this drawing, a memory module 10 includes 11-1-ranked and 11-2-ranked devices that are accessible at the same time. These devices are sixteen dynamic random access memories (DRAMs) 12. These DRAMs 12 are divided into two groups formed on both faces of a module substrate and each of the two groups includes eight DRAMs 12. These eight DRAMs 12 are divided into four memory groups and each of the four memory groups includes two DRAMs. One of the two DRAMs is mounted on one face of the module substrate and the other is mounted on the other face thereof. These two DRAMs are commonly wired. Therefore, this drawing shows only eight DRAMs 12. That is to say, each of the memory groups is paired with the other memory group adjacent thereto. Further, the rank of one of each pair of the adjacent memory groups is different from that of the other.

Thus, according to this embodiment, one DRAM 12 on the top surface of the module substrate is paired with another DRAM 12 on the under surface thereof so as to form one memory group. One of the pair of adjacent memory groups is 11-1-ranked and the other is 11-2 ranked. That is to say, the memory groups are provided so that the rank of one of adjacent memory groups is different from that of the other. However, the DRAMs 12 may be provided on the top surface and under surface of the module substrate so as to be adjacent and close to one another. In this case, adjacent two memory groups function as one unit. One of the two adjacent memory groups may include two or three DRAMs 12 so that the two adjacent memory groups include four or five DRAMs 12.

Each of the DRAMs 12 has a command-address (CA) signal terminal, a data (DQ) signal terminal, a CA-active termination control (ODT-CA) signal terminal, and a clock (WCLK) signal terminal. The CA signal terminal has an active-termination circuit.

The memory module 10 further has four CA-signal registers (CARs) 13 so as to divide the DRAMs 12 into two groups. As in the case of the DRAMs 12, the CARs 13 are mounted on the top surface and under surface of the module substrate and commonly wired. Therefore, this drawing shows two CARs 13. Each of the CARs 13 has two CA-signal input terminals, a CA-signal output terminal, and a WCLK-signal terminal.

Next, the configuration of signal wiring and connection will be described with reference to this drawing.

CA-signal wiring between the DRAMs 12 and the CARs 13 is established as below. Adjacent two memory groups including the DRAMs 12 are paired with each other and connected to each other through wiring with a T-branch structure. Where one of the pair of memory groups, for example, the 11-1-ranked memory group operates, the CA-signal terminals of the DRAMs 12 of the 11-2 ranked memory group are turned on and actively terminated.

This T-branch structure allows for reducing the length of wiring from the adjacent DRAMs 12 to a branch point as much as possible. That is to say, the length of a stub can be reduced as much as possible. This branch point is provided at a predetermined position so that the length of wiring of this pair of memory groups from the branch point to the CAR 13 becomes the same as that of another pair of memory groups adjacent thereto. Subsequently, significant waveform distortion can be prevented even though high-speed signals are input to the memory module 10.

DQ-signal wiring forms the T-branch structure so as to pair adjacent DRAMs 12 with each other and is terminated actively at a DRAM 12 adjacent to a DRAM 12 in operation.

ODT-CA-signal wiring connected to each of the DRAMs 12 extends from a module terminal corresponding to the DRAM 12.

As shown in this drawing, WCLK-signal wiring is provided for each of the DRAMs 12 and each of the CARs 13. That is to say, the WCLK-signal wiring has a T-branch structure so as to pair adjacent DRAMs 12 with each other and adjacent CARs 13 with each other. The WCLK-signal wiring has two wires respectively connecting to the pair of adjacent DRAMs 12 or the pair of adjacent CARs 13. One of the two wires is opened and the other is terminated.

Where a CA signal is transmitted from the CAR 13 to the 1-ranked DRAM 12, a CA active-termination circuit of the 2-ranked DRAM 12 is turned on. On the other hand, where another CA signal is transmitted from the CAR 13 to the 2-ranked DRAM 12, a CA active-termination circuit of the 1-ranked DRAM 12 on one face of the module substrate is turned on.

An effective termination resistance value of the active termination circuit of one of the DRAM 12s is the same as that of characteristic impedance value of signal wiring connected thereto.

Figure 4A:
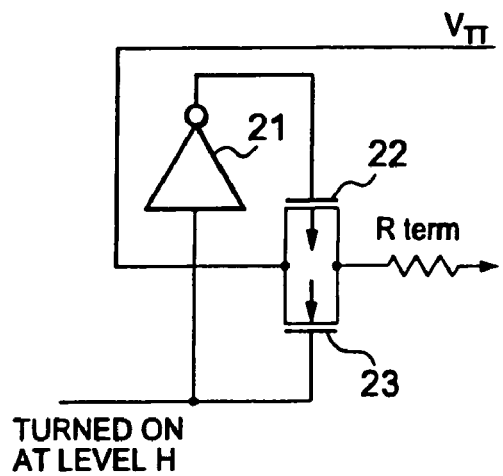
FIG. 4A illustrates an example VTT active-termination circuit that can be used for the present invention.
Figure 4B:
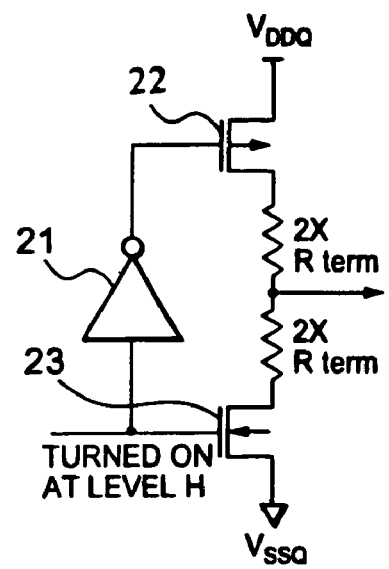
FIG. 4B illustrates an example center-tap active-termination circuit that can be used for the present invention.

FIGS. 4A and 4B show example active-termination circuits.

FIG. 4A shows a VTT active-termination circuit including a resistor Rterm connected to a termination power 21 via pass transistors 22 and 23 in parallel. Where the value of a termination voltage is one-second of a voltage $V_{DDQ}$, the resistor Rterm should be connected to this termination power 21. However, the termination voltage value of the VTT may be the same as that of $V_{DDQ}$, as required. FIG. 4B shows a center-tap active-termination circuit including transistors 22 and 23 in series and two resistors 2×Rterm. A termination voltage is connected to a center tap between the transistors 22 and 23 and the two resistors 2×Rterm. Another voltage source is not necessary where the value of the termination voltage is one-second of the voltage $V_{DDQ}$, though the power consumption increases.

A termination resistor is provided at the signal-input side of each of the CARs 13.

The configuration of a memory system will now be described with reference to FIGS. 5, 6, and 3.

Figure 5:
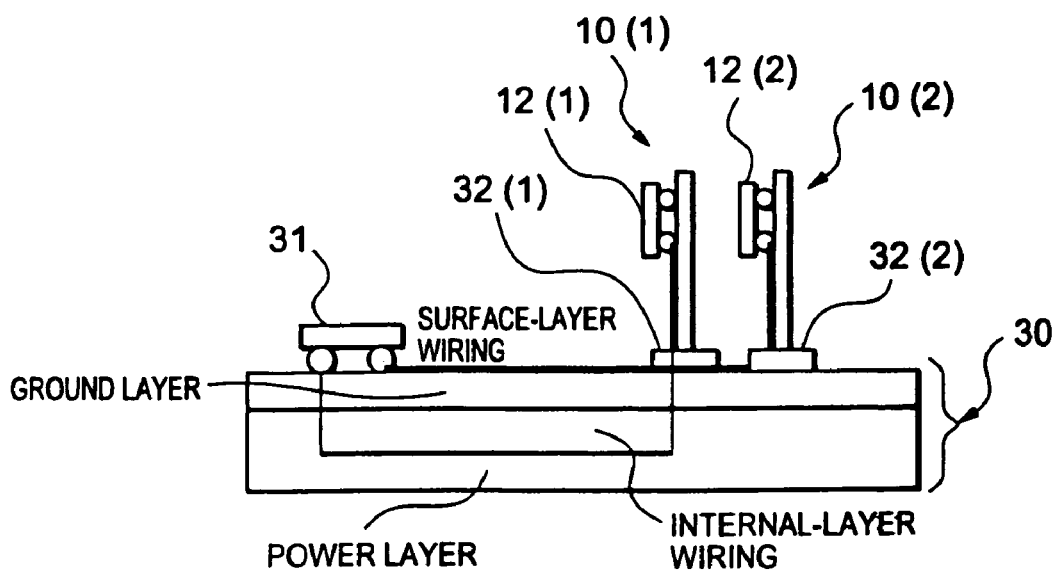
FIG. 5 illustrates an example configuration of a memory system according to the present invention.

As shown in FIG. 5, two memory modules 10(1) and 10(2) and a memory controller 31 are mounted on a mother board 30. A signal between terminals of the memory controller 31 and the memory module 10(1) and a signal between the terminals of the memory controller 31 and the memory module 10(2) are independently wired and connected therebetween. The terminal of the memory module 10(1) is formed in a connector 32(1) extending from the DRAMs 12 and the CARs 13. Further, the terminal of the memory module 10(2) is formed in a connector 32(2) extending from the DRAMs 12 and the CARs 13.

As shown in FIG. 5, the position at which the memory module 10(1) is provided is closer to the memory controller 31 than the position at which the memory module 10(2) is provided is. Wiring between the memory module 10(1) and the memory controller 31 is surface-layer wiring and wiring between the memory module 10(2) and the memory controller 31 is internal-layer wiring, so that the length of wiring between the memory controller 31 and the connector 32(1) is substantially the same as the length of wiring between the memory controller 31 and the connector 32(2). A ground is provided between the surface-layer wiring and the internal-layer wiring as a ground layer. Further, a power layer is provided on an under face of the mother board 30.

Figure 6:
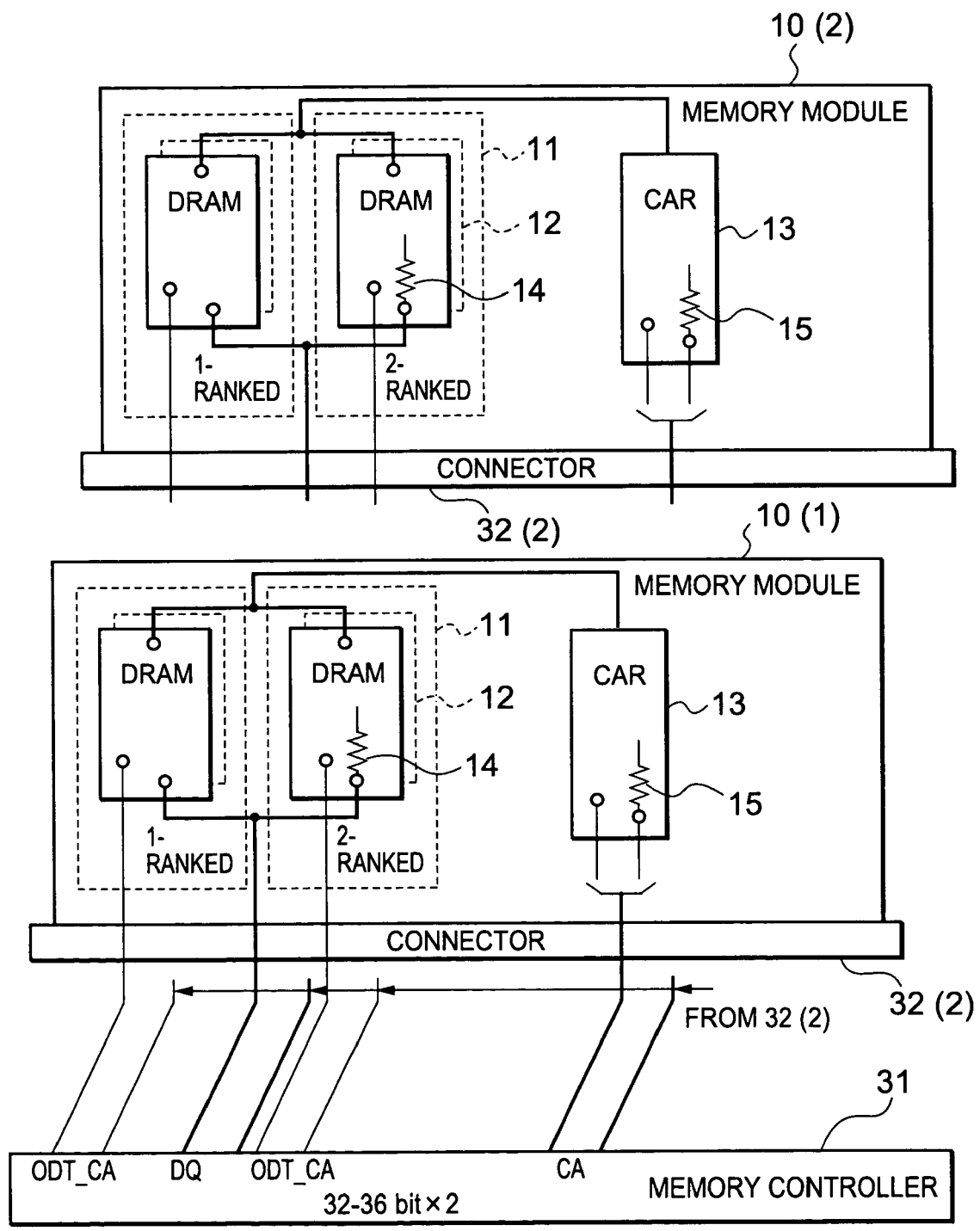
FIG. 6 illustrates example signal wiring of the memory system.
Figure 7:
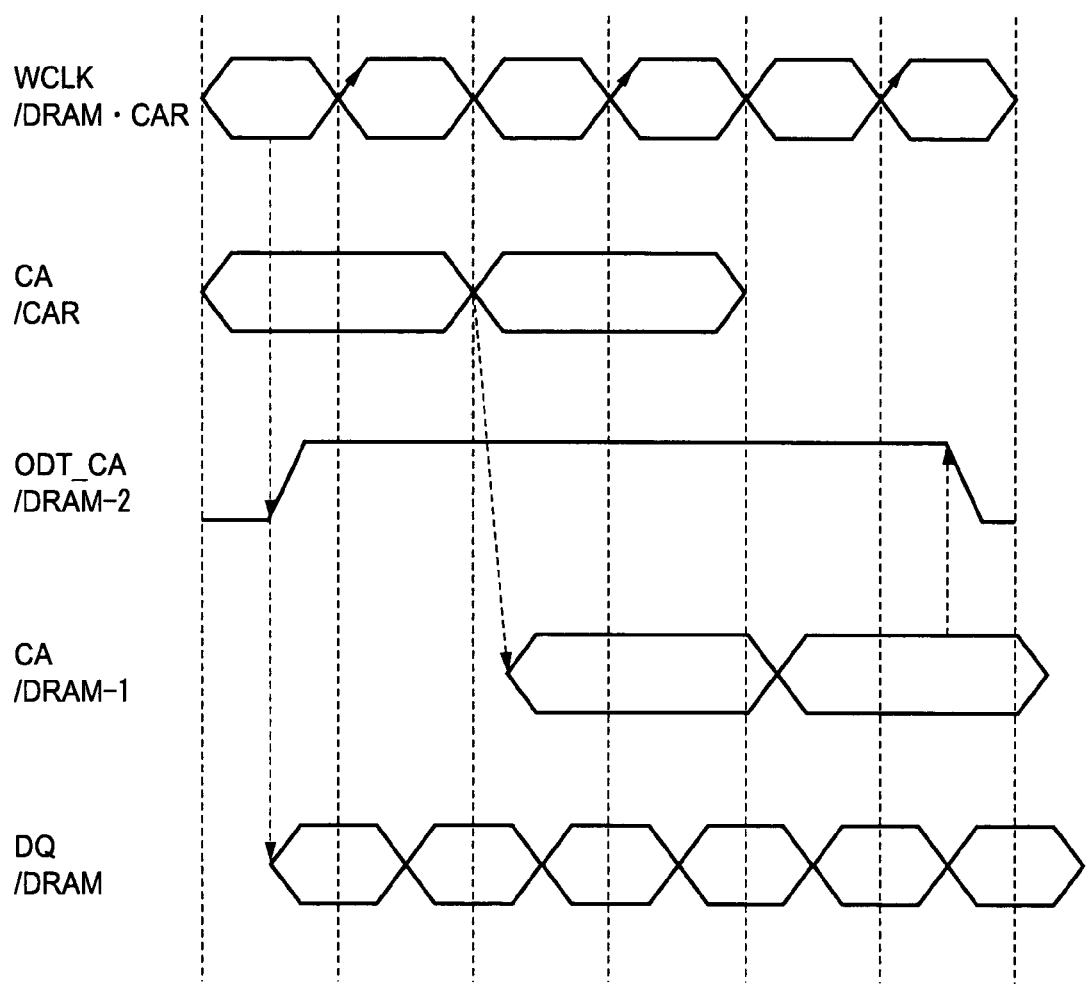
FIG. 7 is a time chart illustrating an example operation performed by the memory module.

FIG. 6 shows part of the memory system. Main operations of the memory system will now be described with reference to FIG. 7.

Where a CA signal is transmitted to the 1-ranked DRAM 12, the memory controller 31 outputs the CA signal to the CAR 13 and an ODT_CA signal to the 2-ranked DRAM 12 over a time period including two clock cycles per every instruction in synchronization with a WCLK signal. This synchronization is achieved by center aligning, that is to say, by providing a clock edge at the center of a period where data is valid. Subsequently, the CA signal is input to the CAR 13 and the active termination circuit of the 2-ranked DRAM 12 is turned on.

Then, the CAR 13 outputs CA signals to the 1-ranked DRAM 12. The 1-ranked DRAM 12 receives each of the CA signals at an even-numbered edge indicated by an arrow of the WCLK signal. The ODT_CA signal is turned off when a period of time corresponding to one half cycle elapses after the last CA signal is output.

Where a DQ signal is written into the 1-ranked DRAM 12, a DQ active-termination circuit of the 2-ranked DRAM 12 is turned on. Where the DQ signal is transferred to the 2-ranked DRAM 12, only the active-termination circuit of the 1-ranked DRAM 12 on one face of the module substrate is turned on. This control is performed by a CA resistor. Where the DQ signal is read, the DQ signal may be transferred in synchronization with a DQ strobe signal as in the case of a known DDR-SDRAM. If the memory controller 31 has input-timing optimization capability, the DQ strobe signal may not be used.

Figure 8:
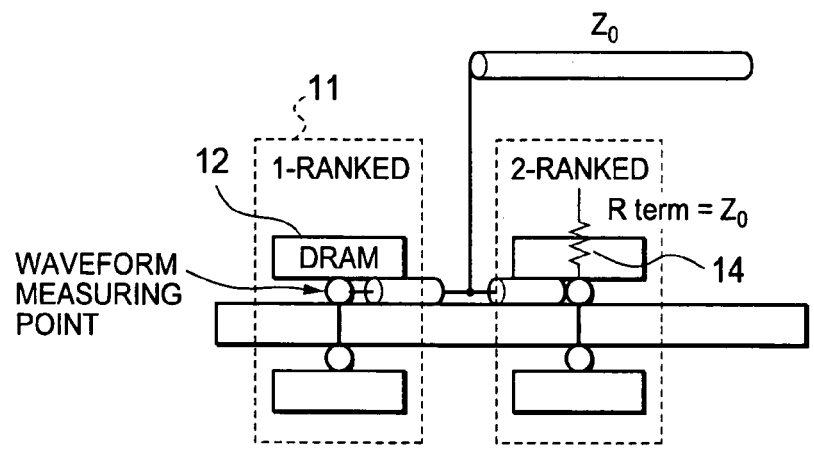
FIG. 8 schematically illustrates example wiring with a T-branch structure that can be used for the memory module.
Figure 9:
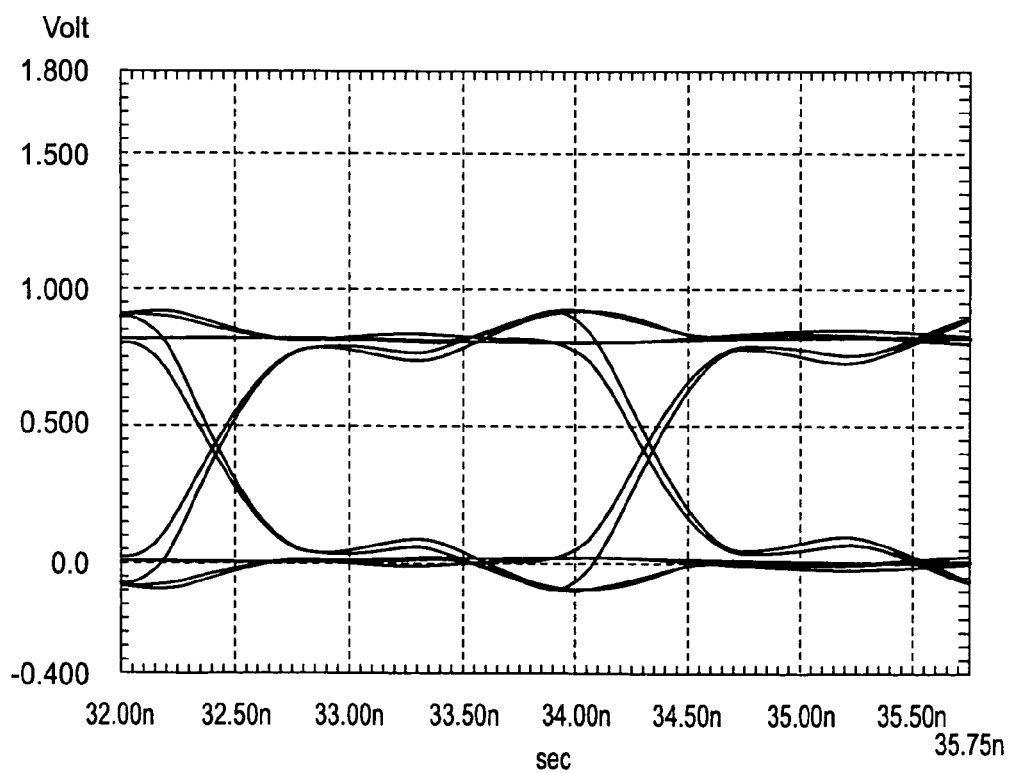
FIG. 9 illustrates example simulation waveforms obtained at a measuring point shown in FIG. 8.

Improved waveforms achieved by the present invention will now be described with reference to FIG. 8 showing the configuration of part of the memory system and FIG. 9 showing simulation waveforms.

Since the T-branch wiring according to the present invention is formed between adjacent DRAMs 12, the length of a stub is relatively short, for example, a little over ten millimeters. Therefore, if signal reflections occur at the open end of the 1-ranked DRAM 12 during signal reception, the waveforms are prevented from being significantly distorted due to a small time constant. Conversely, fine waveforms can be obtained by moderate signal reflections.

Where active termination is performed in the 2-ranked DRAM 12 on the signal-non-reception side being one of the DRAMs 12 paired with each other through T-branch wiring, the wiring connected to the 1-ranked DRAM 12 on the signal-reception side forms an open end. Therefore, signal reflections occur and the rise and fall of signal waveforms become sharp, whereby improved signal waveforms can be obtained.

Figure 10:
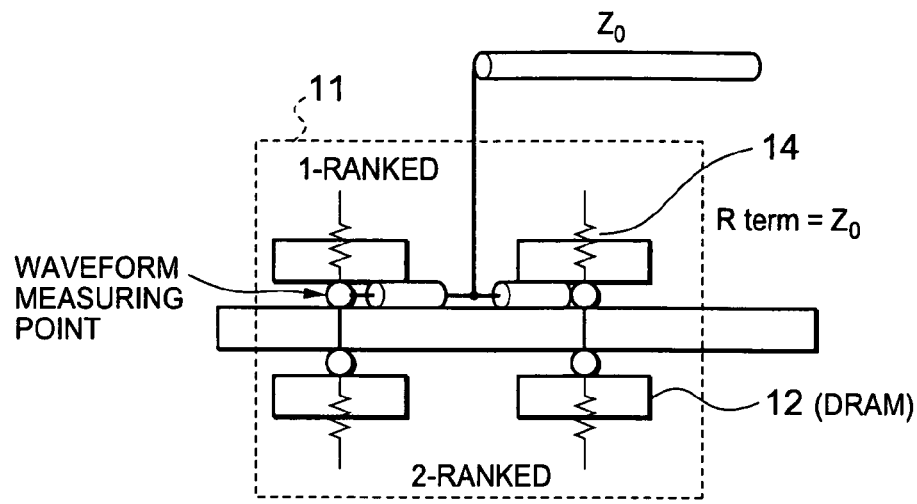
FIG. 10 is a schematic diagram illustrating an example where active termination is performed in all DRAMs shown in FIG. 8.
Figure 11:
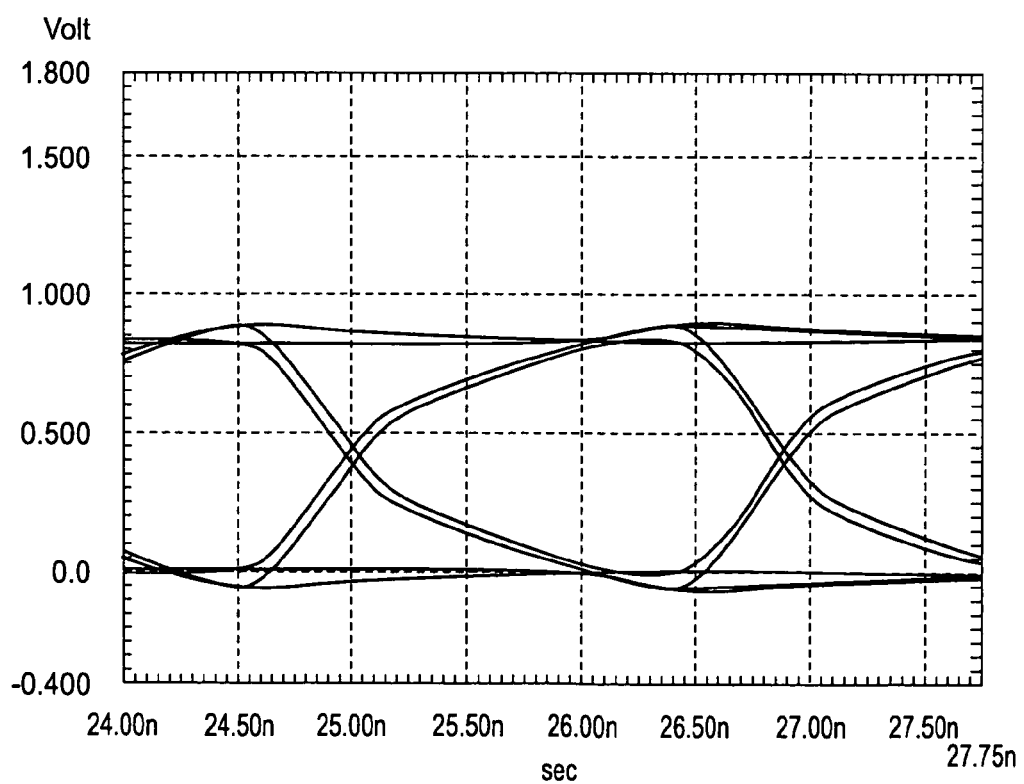
FIG. 11 illustrates example simulation waveforms obtained at a measuring point shown in FIG. 10.

FIG. 10 is a schematic diagram showing an example configuration of part of the memory module and FIG. 11 shows example signal waveforms obtained when the 1-ranked DRAM 12 on the signal-reception side is terminated. In this case, a signal directly reaches the terminated part, and a reflected signal reaches the terminated part with a predetermined delay. Therefore, the rise and fall of the signal waveforms become blunt.

Figure 12:
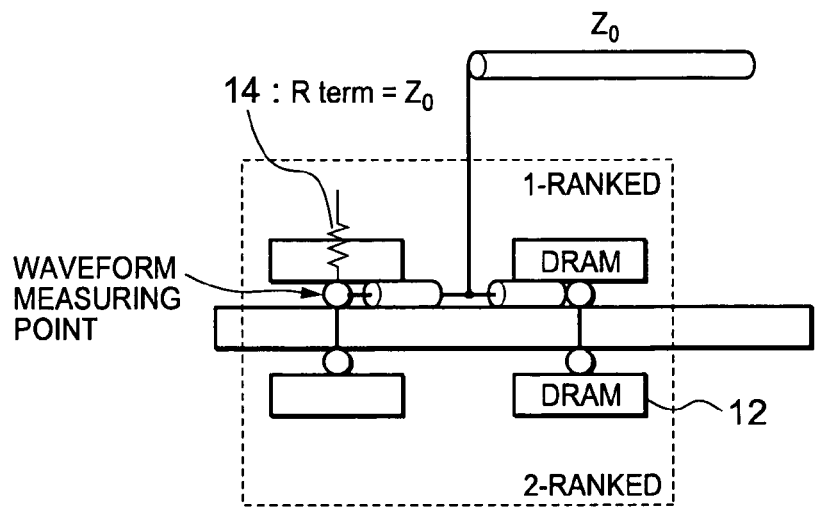
FIG. 12 is a schematic diagram illustrating an example where a position at which active termination is performed is moved from the DRAM on the signal-non-reception side of FIG. 8 to a DRAM on the signal-reception side.
Figure 13:
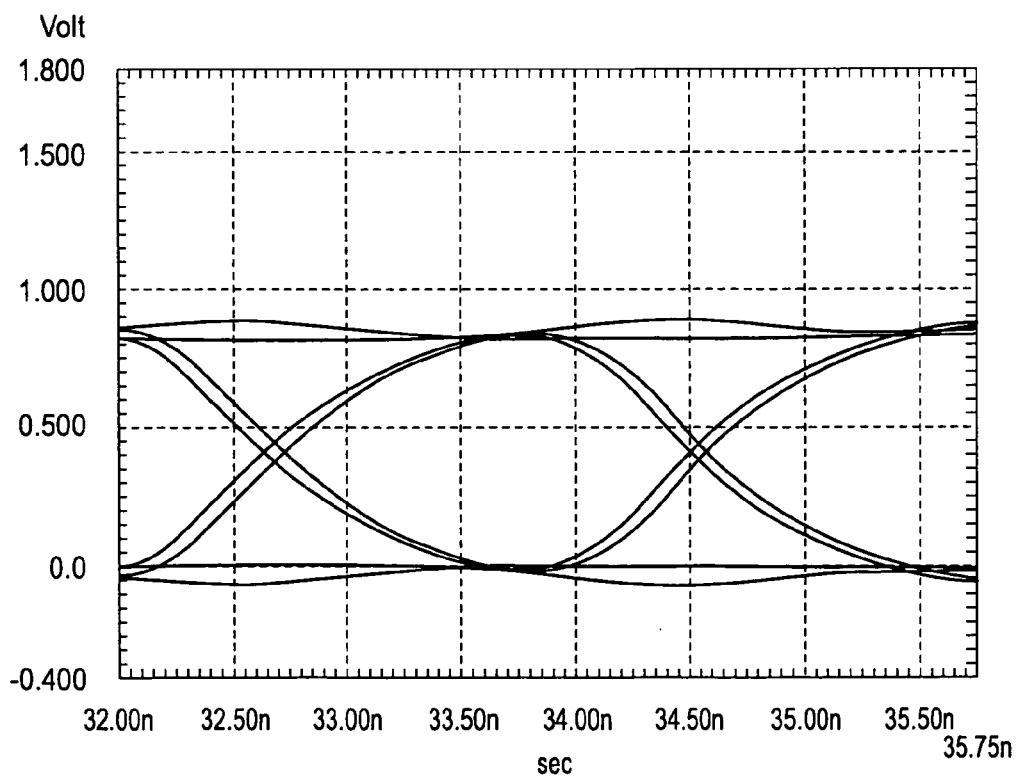
FIG. 13 illustrates example simulation waveforms obtained at a measuring point shown in FIG. 12.

FIG. 12 is a schematic diagram showing another example configuration of part of the memory module and FIG. 13 shows example signal waveforms obtained when the 1-ranked DRAM 12 on the signal-reception side is terminated. As in the above-described case, a signal directly reaches the terminated part, and a reflected signal reaches the terminated part with a predetermined delay. Therefore, the rise and fall of the signal waveforms become blunt.

The above-described wiring is used for transmitting and receiving CA signals between the DRAM 12 and the CAR 13. However, the wiring can be used for transmitting and receiving signals between the DRAM 12 and an element other than the CAR 13. For example, a PLL (phase-locked-loop) circuit can be used for transmitting and receiving a WCLK signal.

Without being limited to the above-described block diagrams, any part of this memory module can be replaced with another part as long as the above-described capabilities of the present invention can be achieved.

A second embodiment of the present invention will now be described with reference to FIGS. 14 to 19.

Figure 14:
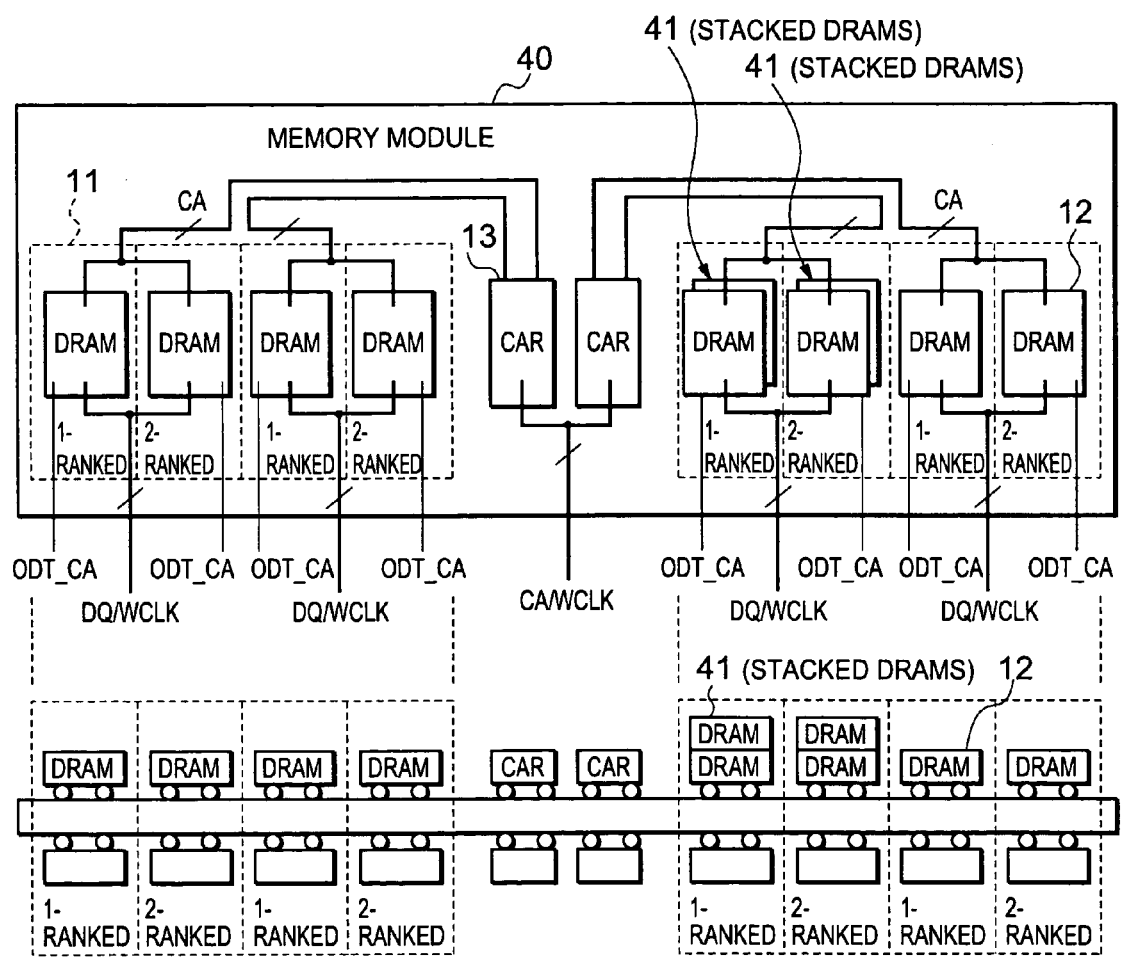
FIG. 14 illustrates another example configuration and block wiring of the memory module different from those of FIG. 3 in that eighteen DRAMs including fourteen DRAMs and two units of two DRAMs stacked on each other are used.
Figure 15:
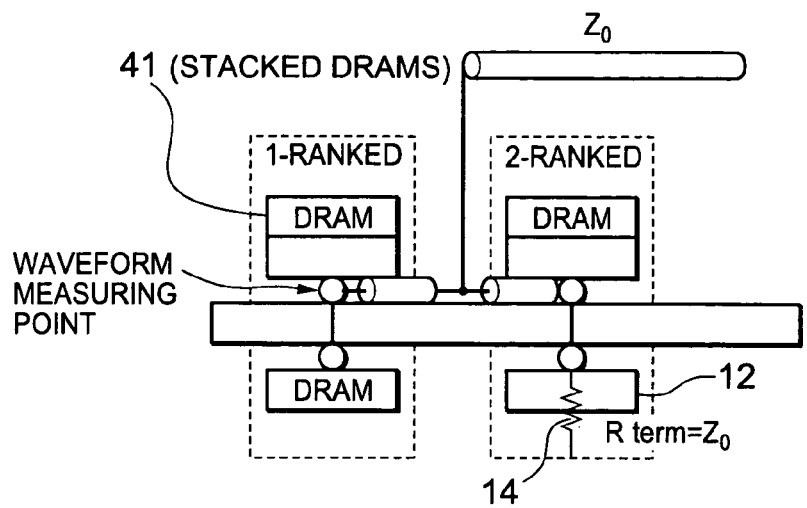
FIG. 15 illustrates example wiring with a T-branch structure that can be used for the memory module shown in FIG. 14.
Figure 16:
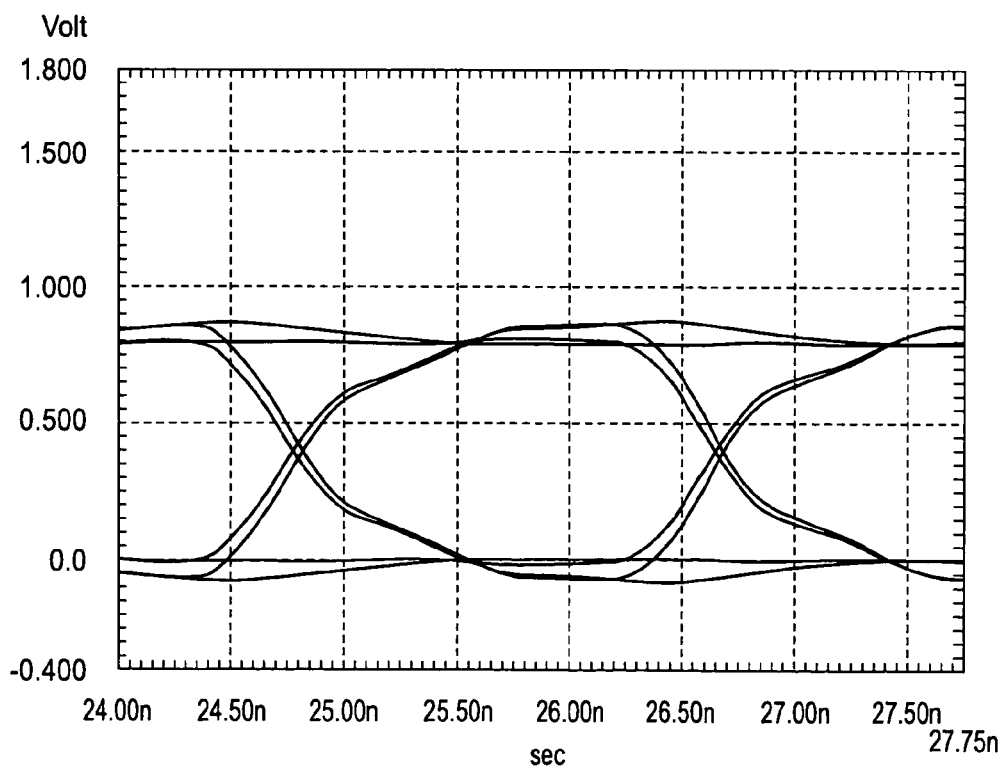
FIG. 16 illustrates example simulation waveforms obtained at a measuring point shown in FIG. 15.

According to this embodiment, eighteen DRAMs 12 are used in a memory module 40, as shown in FIG. 14. That is to say, two DRAMs 12 are added to the DRAMs 12 of the first embodiment. These two added DRAMs 12 are stacked on a predetermined 1-ranked DRAM 12 and a predetermined 2-ranked DRAM 12 being adjacent thereto and paired therewith, whereby two units 41 of two DRAMs 12 stacked on each other are formed. One of the two units 41 of the stacked DRAMs 12 is provided on one face of the module substrate and a DRAM 12 is provided on the other face thereof so as to form a memory group. The other of the two units 41 of the stacked DRAMs 12 on one face of the module substrate and another DRAM 12 on the other face thereof also form another memory group. According to this configuration, active termination is performed in the DRAMs 12 on the other face of the module substrate. FIG. 16 shows simulation waveforms obtained by the above-described configuration. These simulation waveforms are a little blunter than the simulation waveforms shown in FIG. 9 but sharper than those shown in FIGS. 11 and 13.

Figure 17A:
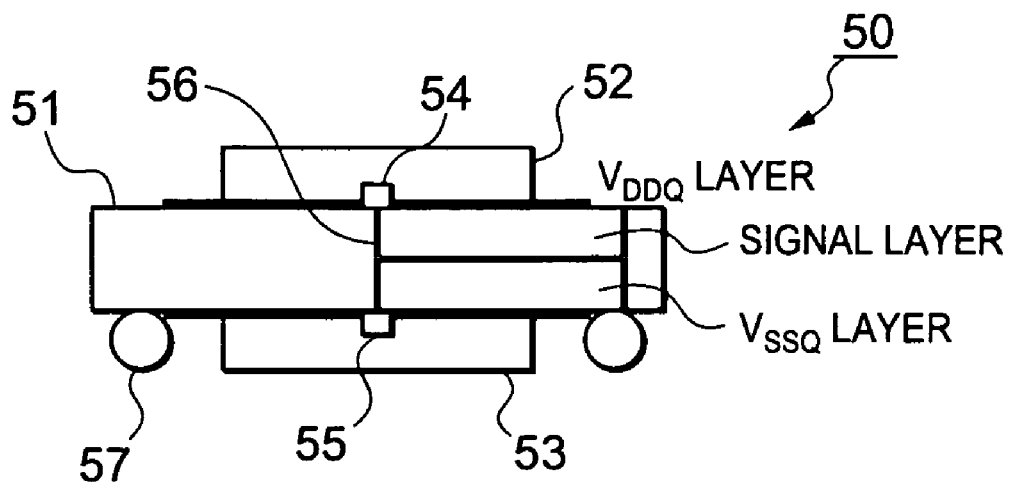
FIG. 17A illustrates an example topology of signal wiring used for a package substrate of the stacked DRAMs shown in FIG. 14.
Figure 17B:
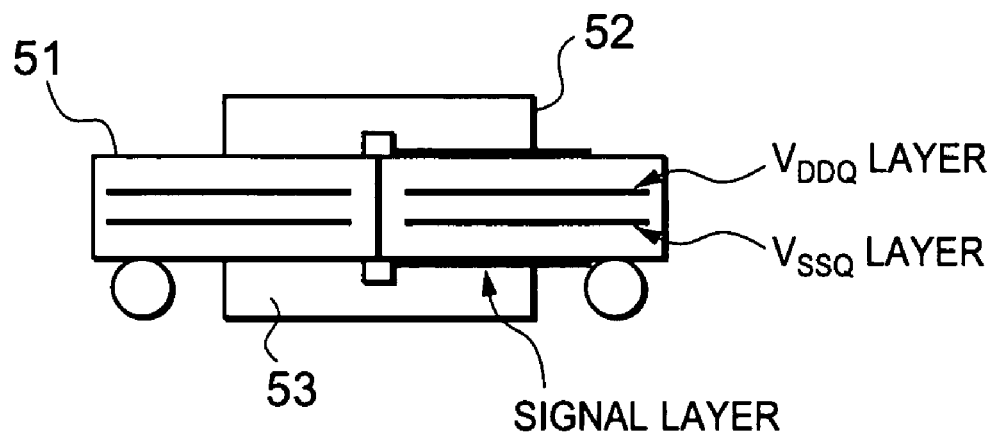
FIG. 17B illustrates another example topology of signal wiring used for the package substrate of the stacked DRAMs shown in FIG. 14.

Each of FIGS. 17A and 17B shows example signal wiring formed in stacked DRAMs 50 according to this embodiment. The stacked DRAMs 50 includes DRAMs 52 and 53 formed as memory chips. The DRAM 52 is provided on one face of a printed circuit board 51 and the DRAM 53 is provided on the other face thereof. That is to say, signal wiring extending from a ball terminal 57 is connected to a pad 54 of the DRAM 52 and a pad 55 of the DRAM 53 through a via hole 56.

In FIG. 17A, a signal layer is connected to the pads 55 and 54. A voltage $V_{DDQ}$ layer is formed on one face of the printed circuit board 51 and a voltage $V_{SSQ}$ layer is formed on the other face thereof. Thus, the signal wiring of the stacked DRAMs 50 is provided between a power layer and a ground layer so as to form a strip line. Subsequently, the quantity of noise on signals decreases.

In FIG. 17B, a signal layer is connected to the pads 54 and 55 and externally connected to one of the DRAMs 52 and 53. In this case, the signal layer is externally connected to the DRAM 53. The voltage $V_{DDQ}$ layer and the voltage $V_{SSQ}$ layer are formed between internal layers of the printed circuit board 51. Since the power layer and the ground layer are provided so as to be adjacent to each other, a loop inductance between the power and the ground decreases, and the noise quantity in the power and the ground reduces.

Figure 18:
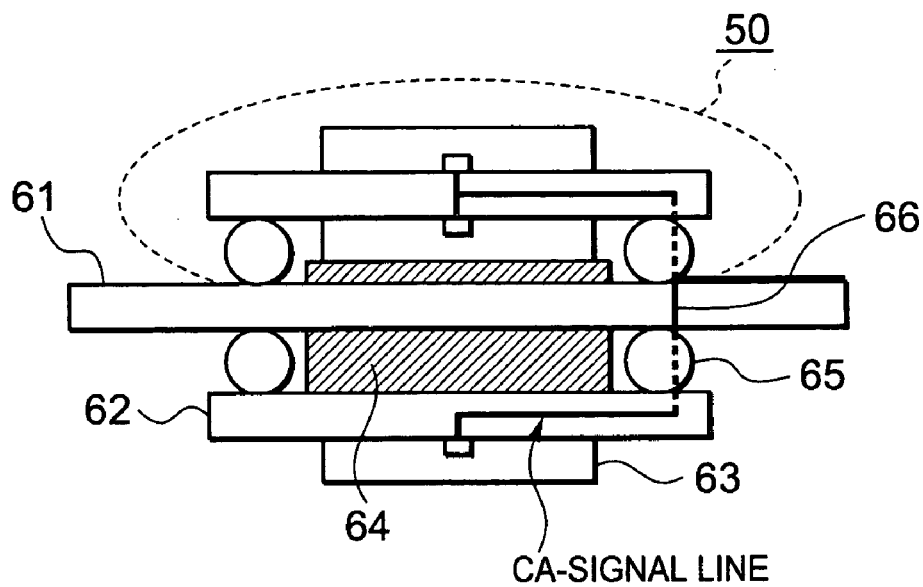
FIG. 18 illustrates an example topology of CA-signal wiring shown in FIG. 14.

FIG. 18 shows wiring for taking out a CA signal of the stacked DRAMs 50. The CA signal of the stacked DRAMs 50 is taken out from an internal layer of the printed circuit board 51, as shown in FIG. 17A. Then, the CA signal is transmitted to a module substrate 61 through a ball terminal 57. Further, a CA signal of a DRAM 63 provided on an under face of the stacked DRAMs 50 is taken out from an internal layer of a package substrate 62 and transmitted to the module substrate 61 through a ball terminal 65. That is to say, the CA-signal wiring is connected to both the DRAMs 50 and 63 through, for example, a via hole 66. Further, the stacked DRAMs 50 and the package substrate 62 are mounted on buffer materials 64 provided on both sides of the model substrate 61. Since the load on the CA-signal wiring connected to the stacked DRAMs 50 and the amount of time delay increase, the length of this CA-signal wiring should be reduced so as to be smaller than that of CA-signal wiring with a different configuration so as to synchronize the timing of this CA signal with the timing of other CA signals.

Figure 19:
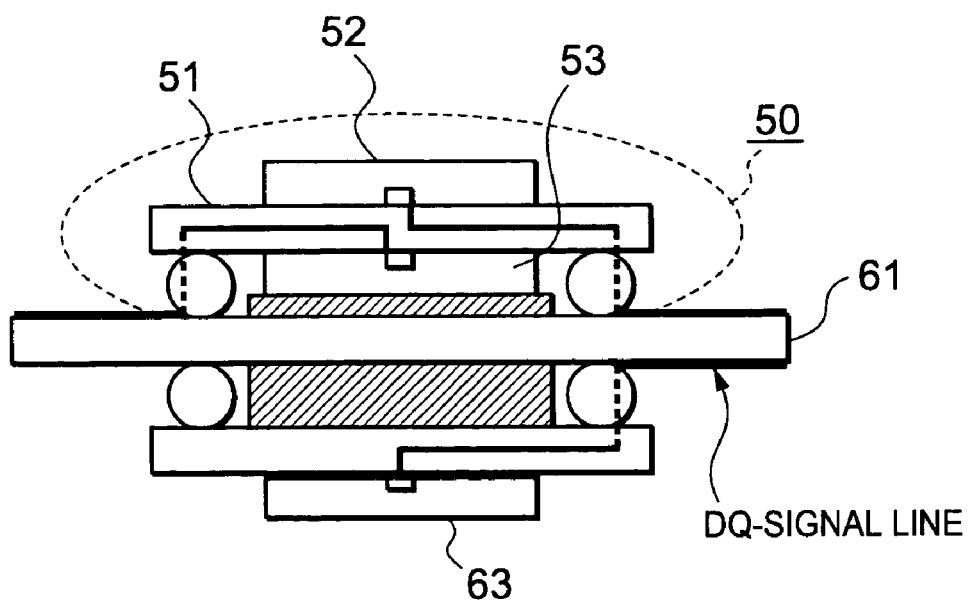
FIG. 19 illustrates an example topology of DQ-signal wiring shown in FIG. 14.

FIG. 19 illustrates wiring for taking out DQ signals of the stacked DRAMs 50. The positions at which the stacked DRAMs 50 and the DRAM 63 are provided are the same as those shown in FIG. 18. However, each of the DQ signals is separately taken out from pads of the DRAMs 52, 53, and 63. That is to say, the DQ-signal wiring is formed of a single wire and connected to the pads. Each of the pads is provided on one face of each of the DRAMs.

Figure 20:
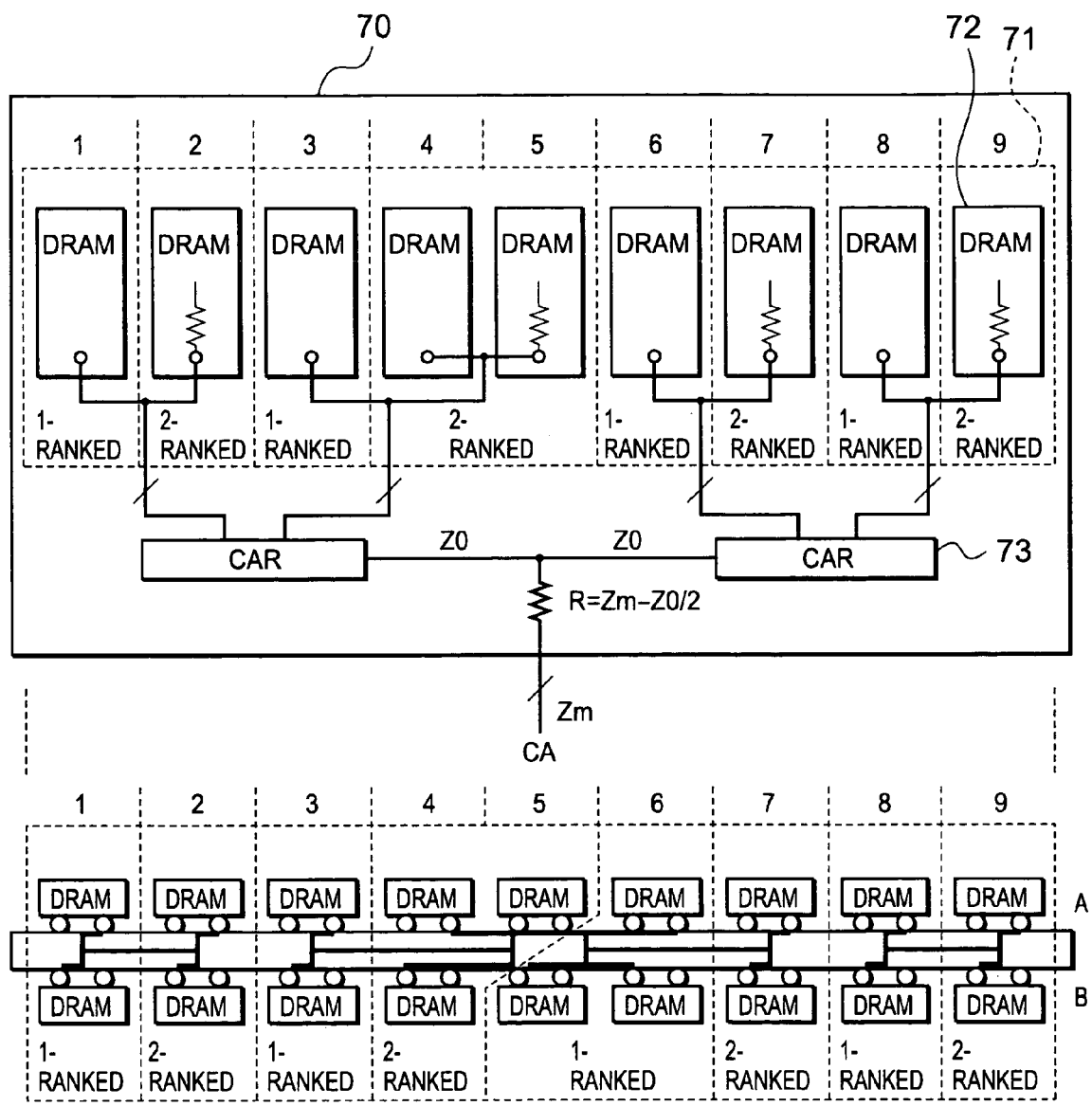
FIG. 20 illustrates another example configuration and block wiring of the memory module of the present invention where eighteen DRAMs different from those shown in FIG. 14 are used.

A third embodiment of the present invention will now be described with reference FIG. 20. In this embodiment, eighteen DRAMs with ECC (error checking and correcting) capability different from the DRAMs shown in FIG. 14 are used.

As shown in this drawing, a memory module 70 includes a plurality of 71-ranked devices. These 71-ranked devices comprise nine DRAMs 72 on a top face of a module substrate and nine DRAMs 72 on an under face thereof. A fifth DRAM 72 on the top face, that is, the DRAM 72 at the center of the top face is 2-ranked. On the other hand, a fifth DRAM 72 on the under face, that is, the DRAM 72 at the center of the under face is 1-ranked. These first to ninth DRAMs 72 on the top face are designated by reference character A, and these first to ninth DRAMs 72 on the under face are designated by reference character B.

Subsequently, the DRAMs 1A, 1B, 3A, 3B, 5B, 6A, 6B, 8A, and 8B are 1-ranked. Further, the DRAMs 2A, 2B, 4A, 4B, 5A, 7A, 7B, 9A, and 9B are 2-ranked. Adjacent memory groups at the center of the memory module 70 are paired with each other. The pair of adjacent memory groups includes the 1-ranked DRAMs 5B, 6A, and 6B, and the 2-ranked DRAMs 7A and 7B. Other adjacent memory groups at the center of the memory module 70 are also paired with each other. This pair of adjacent memory groups includes the 1-ranked DRAMs 3A and 3B, and the 2-ranked DRAMs 4A, 4B, and 5A. Each of these pairs of adjacent memory groups has a T-branch structure as in the above-described embodiments.

Where a CA signal is transferred from a CAR 73 to the 1-ranked DRAMs 72, a CA active-termination circuit of each of the 2-ranked DRAMs 72 is turned on. Where another CA signal is transmitted from the CAR 73 to the 2-ranked DRAMs 72, a CA active-termination circuit of the 1-ranked DRAM 72 on one face of the module substrate is turned on. For achieving this embodiment, two CARs 73 should be provided under the DRAMs 72, as shown in this drawing. Since T-branch wiring extending from a CA-signal terminal of the memory module 70 becomes large, a wiring-impedance matching resistor R (=Zm−Z0/2) is provided between the CA-signal terminal and a branch point of the T-branch wiring. Here, Zm indicates the characteristic impedance of the mother-board wiring. Further, Z0 indicates the characteristic impedance of the memory-module wiring. By using the above-described resistor R, the length of wiring between the CARs 73 and the DRAMs 72 reduces. Further, time required for transmitting signals reduces, whereby clock signals can be generated with speed higher than in the past.

Figure 21:
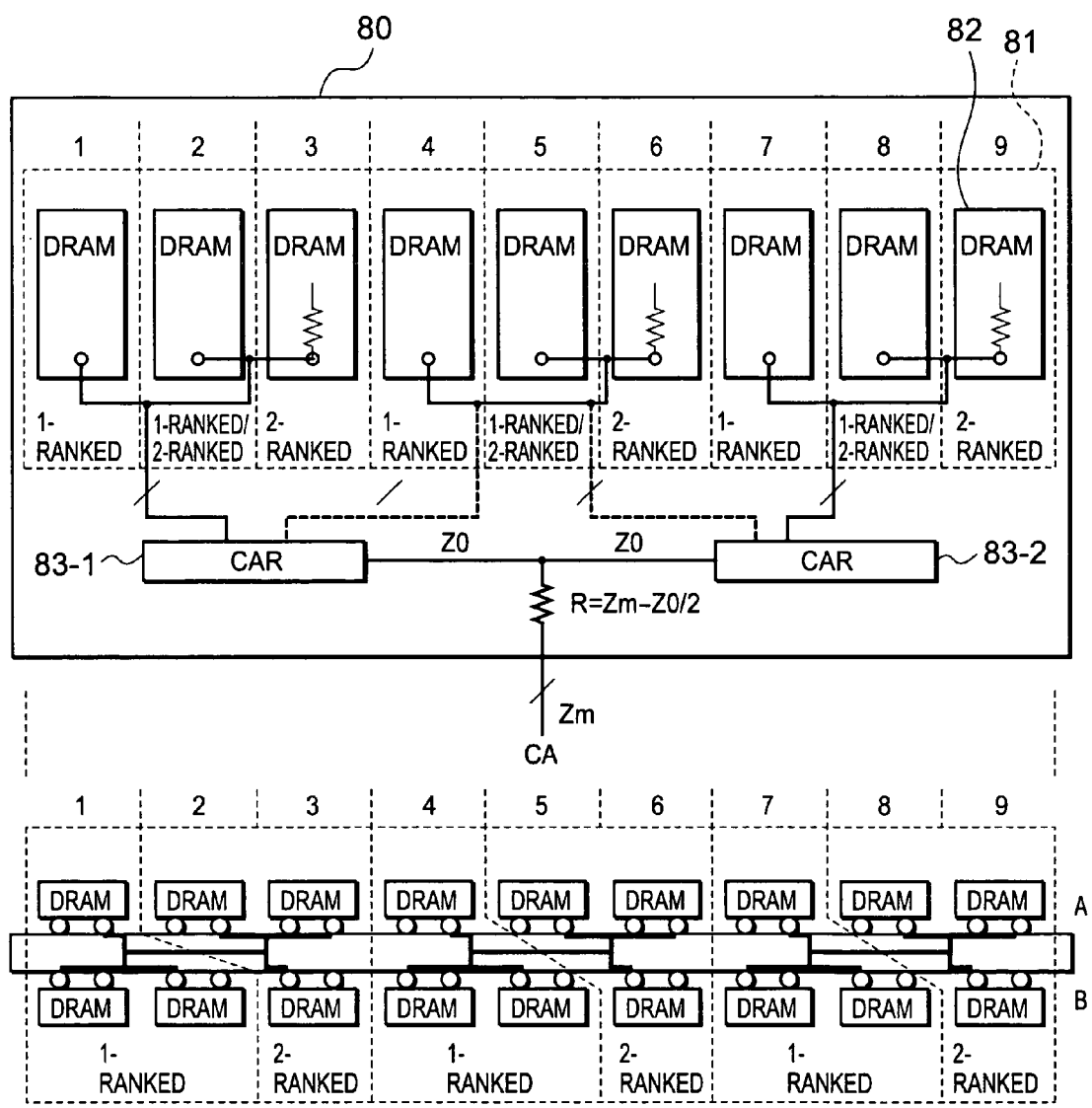
FIG. 21 illustrates another example configuration and block wiring of the memory module of the present invention wherein eighteen DRAMs different from those shown in FIGS. 14 and 20 are used.

A fourth embodiment of the present invention will now be described with reference to FIG. 21. This drawing shows eighteen DRAMs with ECC capability. These DRAMs are different from those shown in FIG. 14 and FIG. 20.

As shown in the drawing, a memory module 80 includes 81-ranked devices. These 81-ranked devices comprise nine DRAMs 82 on a top face of a module substrate and nine DRAMs 82 on an under face thereof, as in the case of FIG. 20. Every three memory groups adjacent to one another include at least one 1-ranked memory group and at least one 2-ranked memory group. DRAMs 82 of a memory group at the center of these three memory groups are provided on the top face and under face of the module substrate, as described above. One of these DRAMs 82 of this center memory group is 1-ranked and the other is 2-ranked. Hereinafter, first to ninth DRAMs 82 on the top face are designated by reference character A, and first to ninth DRAMs 82 on the under face are designated by reference character B.

Subsequently, a first CA-signal line extending from the DRAMS 1A to 3A and the DRAMS 1B to 3B is connected to a CAR 83-1. Further, a second CA-signal line extending from the DRAMs 7A to 9A and the DRAMS 7B to 9B is connected to a CAR 83-2. A third CA-signal line extending from the DRAMs 4A to 6A and the DRAMs 4B to 6B are connected to the CAR 83-1 or to the CAR 83-2. However, the third and fourth lines can be connected to both the CARs 83-1 and 83-2, as required. According to this configuration, nine 81-ranked devices or nine DRAMs 82 on each face of the module substrate are divided into three groups. The wiring configurations of these three groups are the same as one another, so that the lengths of lines of these three groups are the same as one another. Subsequently, variations in the waveforms of the three groups are reduced.

Figure 22:
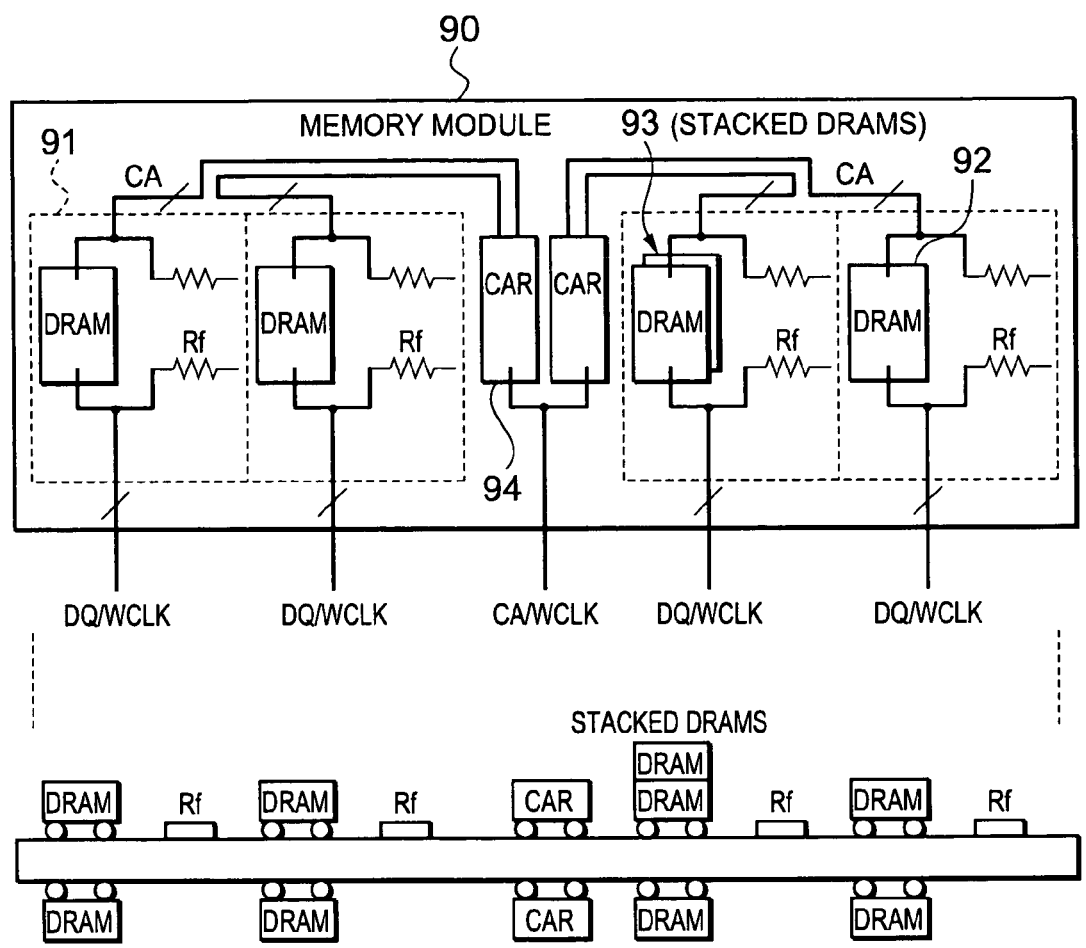
FIG. 22 illustrates another example configuration and block wiring different from those shown in FIGS. 3, 14, 20, and 21 of the memory module of the present invention.

A fifth embodiment of the present invention will now be described with reference to FIG. 22. Nine DRAMs with ECC capability are used in this embodiment.

This drawing also shows a memory module 90 including 91-ranked devices that will be described as below. The above-described nine DRAMs are provided at predetermined positions corresponding to the positions shown in FIG. 14 at which the 1-ranked DRAMs are provided. Seven of these nine DRAMs are provided as DRAMs 92 and two thereof are stacked on each other and provided as stacked DRAMs 93. Further, fixed resistors Rf are provided in place of DRAMs at predetermined positions corresponding to the positions shown in FIG. 14 at which the 2-ranked DRAMs are provided and paired with the DRAMs adjacent thereto. The positions of CARs 94 and signal lines are same as in the case of FIG. 14.

Figure 23:
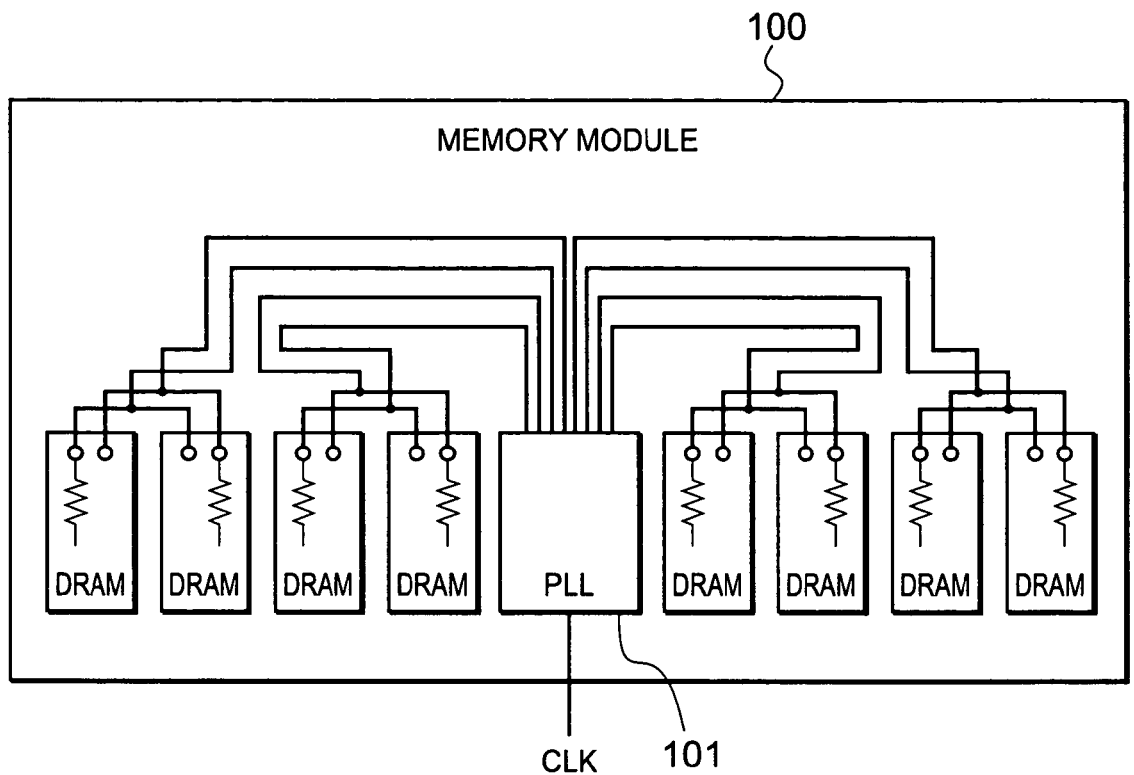
FIG. 23 illustrates example clock-signal wiring used for the memory module of the present invention.

A sixth embodiment relating to clock-signal wiring of the present invention will now be described with reference to FIG. 23. In this embodiment, a PLL circuit 101 is used in place of the above-described CA registers so as to generate clock signals that are connected to the DRAMs. This clock-signal wiring has a T-branch structure so that adjacent DRAMs are paired with each other. Termination is performed in DRAMs on the signal-non-reception side.

Timing margins of the memory system will now be described.

As has been described, the internal-layer wiring is used as the signal wiring extending from the memory controller to the memory module close thereto. The surface-layer wiring is used as the signal wiring extending from the memory controller to the other memory module far therefrom.

According to the configuration of this memory system of the present invention, the above-described two memory modules are accessible at the same time. If accesses are made to the above-described memory modules through two lines and time required for transmitting a signal through one of the lines is the same as that of the other, the timing of inputting a signal to the memory controller through one of the lines differs from the timing of inputting another signal to the memory controller through the other line during signal reading. This difference reduces timing margins of the memory system.

In general, the time required for transmitting a signal through the surface-layer wiring is about 6 ns/m and that for transmitting a signal through the internal-layer wiring is about 7 ns/m. That is to say, the time required for transmitting a signal through the internal-layer wiring is longer than that in the case where a signal is transmitted through the surface-layer wiring. Further, the length of signal wiring extending from the memory controller 31 to the memory module close thereto is about 100 millimeters and the length of signal wiring extending from the memory controller 31 to the memory module far therefrom is about 120 millimeters. Therefore, the internal-layer wiring is used as the signal wiring from the memory controller 31 to the memory module close thereto and the surface-layer wiring is used as the signal wiring from the memory controller 31 to the memory module far therefrom. Consequently, the time required for transmitting a signal from the memory controller 31 to the memory module close thereto becomes the same as the time required for transmitting a signal from the memory controller 31 to the memory module far therefrom, whereby the amount of input-timing-margin reduction of the memory controller 31 during signal reading can be reduced.

Figure 24:
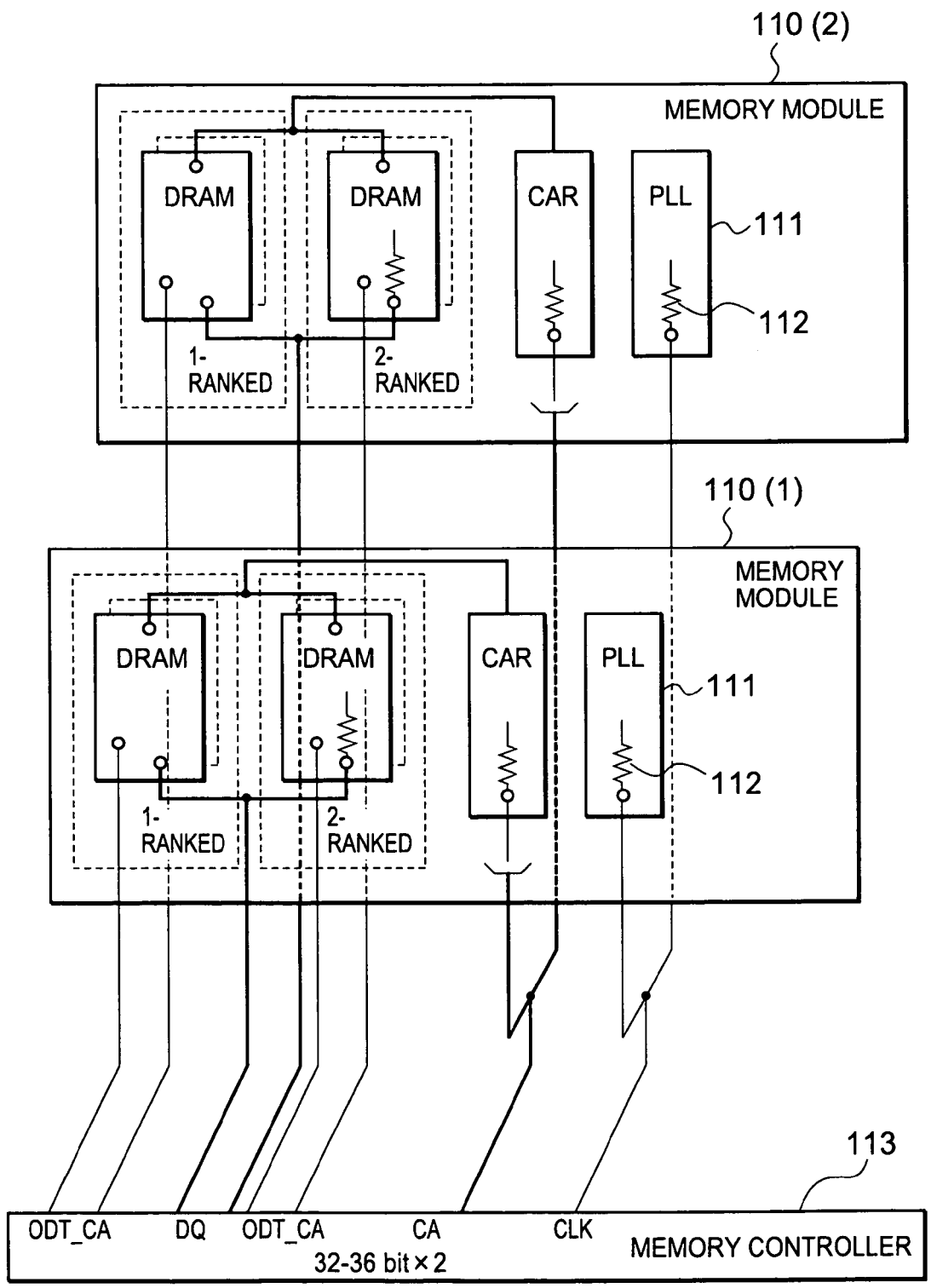
FIG. 24 illustrates example block wiring used for another memory system according to the present invention, the memory system being different from that shown in FIG. 6.

FIG. 24 shows a memory system whose configuration is different from that of the memory system shown in FIG. 6. This memory system has a memory controller 113, a memory module 110(1) including two DRAMs, a CAR, and a PLL, circuit 111 with a termination resistor 112, and a memory module 110(2) including two DRAMs, a CAR, and a PLL circuit 111 with a termination resistor 112. As shown in this drawing, signal wiring between the memory controller 113 and the two DRAMs of the memory module 110(1) may have a T-branch structure. Signal wiring extending from the two DRAMs of the memory module 110(1) to the CAR thereof may also have a T-branch structure. Further, signal wiring between the memory controller 113 and the two DRAMs of the memory module 110(2) may have a T-branch structure. Signal wiring extending from the two DRAMs of the memory module 110(2) to the CAR thereof may also have a T-branch structure. According to the above-described configurations, the number of pins and wires of the memory controller 113 reduces, whereby the cost of manufacturing the memory controller 113 reduces.

A circuit for transmitting an ODT_CA signal will now be described with reference to FIGS. 25 and 26.

Figure 25:
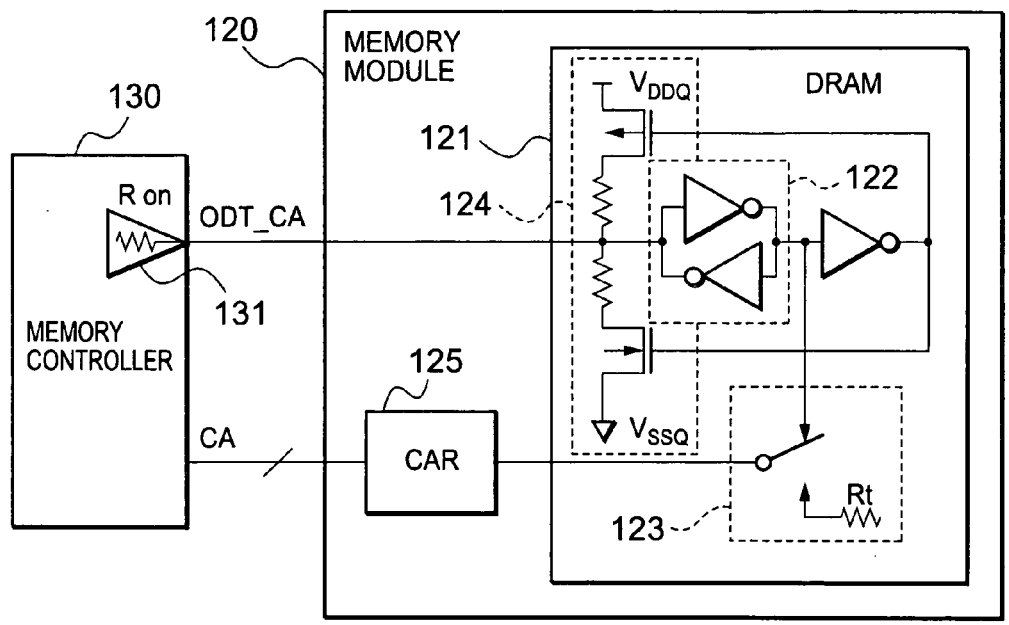
FIG. 25 illustrates an example CA active-termination control circuit used for the memory system of the present invention.
Figure 26:
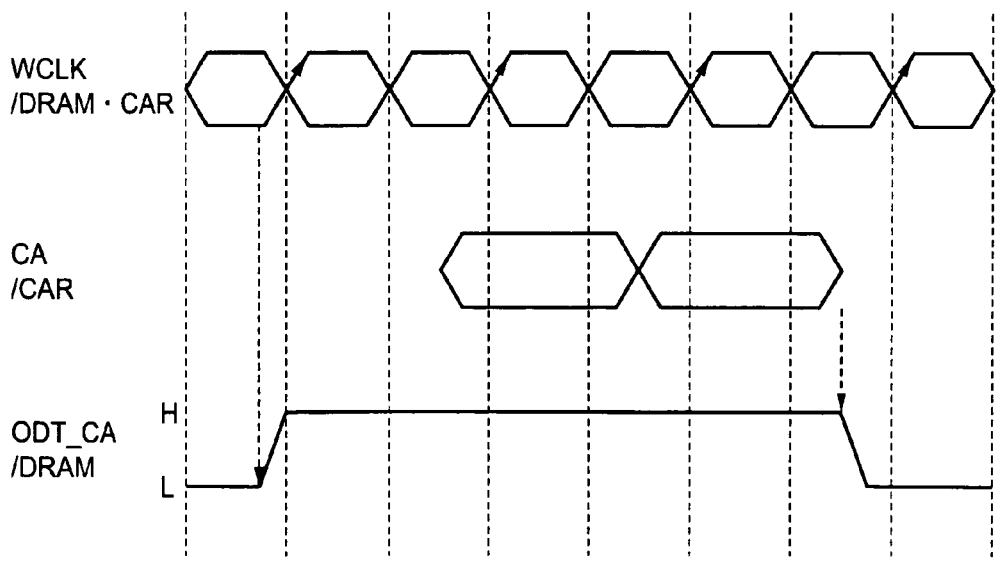
FIG. 26 is a time chart illustrating an example operation performed by another memory module according to the present invention shown in FIG. 25.

As shown in FIG. 25, an ODT_CA signal transmitted from a memory controller 130 is connected to a latch circuit 122 in a DRAM 121 of a memory module 120. An output signal from the latch circuit 122 functions as an ODT_CA active-termination control signal. During transition of the ODT_CA signal from a ground level L to a power-voltage level H, a termination circuit 123 is terminated at a ground. When the ODT_CA signal reaches the power-voltage level H, the termination circuit 123 is terminated at the voltage $V_{DDQ}$. The termination circuit 123 is also terminated at the voltage $V_{DDQ}$ during transition of the ODT_CA signal from the power-voltage level H to the ground level L. The termination circuit 123 is terminated at the ground when the ODT_CA signal reaches the ground level L.

The memory controller 130 has an ODT_CA-signal output circuit 131 including an output resistor Ron. The resistance value of the output resistor Ron is matched to the value of a characteristic impedance Z0 of ODT_CA-signal wiring for reducing noises caused by signal reflections. Subsequently, the resistance value Ron becomes equal to the characteristic impedance Z0. This output resistor Ron terminates an output terminal of the ODT_CA-signal output circuit 131.

As has been described, an ODT_CA signal is latched to the power-voltage level H or the ground level L according to the level of the ODT_CA signal. If the ODT_CA signal is latched to the power-voltage level H, an ODT_CA active terminal circuit 124 on the ground side is turned off. If the ODT_CA signal is latched to the ground level L, the ODT_CA active terminal circuit 124 on the power-voltage side is turned off. In both cases, no currents flow into the ODT_CA active terminal circuit 124 and the power consumption of the DRAM 121 reduces.

Although the above-described signals have been described as single-end signals, differential signals can be used.

What is claimed is:

1. A memory module comprising:
    a module substrate;
    at least one command-address signal register;
    a plurality of memory chips provided on a top face and under face of the module substrate, each of the plurality of memory chips having a command-address signal terminal with an active-termination circuit; and
    command-address signal wiring;
    wherein the command-address signal register is internally wired and connected to the plurality of memory chips;
    wherein the plurality of memory chips is divided so as to form at least one 1-ranked memory group including two or three memory chips that are provided on one face and the other face of the module substrate and near and adjacent to each other and at least one 2-ranked memory group including two or three memory chips that are provided on one face and the other face of the module substrate and near and adjacent to each other;
    wherein the 1-ranked memory group is paired with the 2-ranked memory group adjacent thereto so that this pair of memory groups has four or five memory chips;
    wherein the command-address signal wiring has a T-branch structure and is used for connecting the command-address signal register to the pair of memory groups corresponding thereto; and
    wherein when access is made, one of the pair of memory groups is used during the access and the other is not used and the command-address signal terminals of the memory chips of the memory group that is not used during the access are actively terminated.

2. A memory module according to claim 1, further comprising data signal wiring with T-branch structure for connecting one of the pair of memory groups to the other,
wherein each of the plurality of memory chips further has a data-signal terminal, and
wherein the data-signal terminals of the memory chips of the memory group that is not used during the access are actively terminated.

3. A memory module according to claim 1, further comprising command-address active-termination control signal wiring connected to a module terminal corresponding to any of the memory groups.

4. A memory module according to claim 1, further comprising clock-signal wiring with a T-branch structure,
wherein each of the plurality of memory chips further has a clock signal terminal,
wherein an even-number of the command-address signal registers are provided so as to form at least two groups, wherein the clock-signal wiring is connected to the command-address signal registers and the memory chips so as to connect the at least two groups of command-address signal registers to each other and the pair of memory groups to each other, and
wherein the clock-signal terminals of the memory chips of one of the pair of memory groups are actively terminated.

5. A memory module according to claim 1, wherein each memory group of at least one of the pairs of memory groups adjacent and connected to each other so as to form a T-branch structure has two stacked memory chips on one face of the module substrate and one memory chip on the other face of the module substrate and wherein the command-address signal terminal of the memory chip on the other face is actively terminated.

6. A memory module according to claim 5, wherein four pairs of the memory groups with error checking and correcting (ECC) capability including six memory groups, each of the six memory groups having one memory chip on one face of the module substrate and another memory chip on the other face of the module substrate, and two memory groups, each of the two memory groups having two memory chips stacked on each other on one face of the module substrate and another memory chip on the other face of the module substrate.

7. A memory module according to claim 5, wherein the stacked memory chips include a single memory chip with a first pad provided on one face of a printed circuit board and another single memory chip with a second pad provided on the other face of the printed circuit board, wherein the command-address signal wiring is connected to both the first and second pads through a single wire and the data-signal wiring is connected to one of the first and second pads through another single wire, and wherein a signal line of the stacked memory chips is sandwiched between a power layer and a ground layer so as to form a strip line.

8. A memory module according to claim 1, further comprising a wiring-impedance matching resistor, wherein the at least one command-address signal register is provided under the plurality of memory chips and the wiring-impedance matching resistor is inserted in wiring with a T-branch structure connected to the command-address signal terminals.

9. A memory module according to claim 1, further comprising clock-signal wiring with a T-branch structure for connecting one of the memory groups paired with each other to the other, wherein memory chips of one of the pair of memory groups are terminated.

10. A memory module according to claim 1, wherein each of the plurality of memory chips further has an active-termination circuit for a command-address active-termination control signal, a circuit for latching the command-address active-termination control signal, and a circuit for turning at least part of the active-termination circuit when the command-address active-termination control signal is latched during the active-termination circuit is turned on.

11. A memory system comprising:
a mother board;
first and second memory modules according to claim 1 provided on the mother board; and
a memory controller connected to a plurality of memory chips mounted on the two memory modules so as to control memory capability;
wherein a signal wirings between each of the memory modules and the memory controller are independently connected therebetween.

12. A memory system according to claim 11, wherein the first memory module is provided at a first distance from the memory controller and the second memory module is provided at a second distance longer than the first distance from the memory controller, and wherein signal wiring from the first memory module to the memory controller is formed as internal-layer wiring and signal wiring from the second memory module to the memory controller is formed as surface-layer wiring.

13. A memory system comprising:
a mother board;
first and second memory modules according to claim 1 provided on the mother board; and
a memory controller connected to a plurality of memory chips mounted on the two memory modules so as to control memory capability;
wherein, among signal wirings connecting between each of the memory modules and the memory controller, at least one of the command-address signal and the clock signal is connected through wiring with a T-branch structure near the memory modules on the mother board.

14. A memory chip used for a memory module having at least one command-address signal register and a plurality of memory chips mounted on the memory module, each of the plurality of memory chips having a command-address signal terminal with an active-termination circuit, wherein the command-address signal register is internally wired and connected to the plurality of memory chips, the memory chip comprising:
an active-termination circuit for a command-address active-termination control signal;
a circuit for latching the command-address active-termination control signal; and
a circuit for turning off at least part of the active-termination circuit when the command-address active-termination control signal is latched during the active-termination circuit is turned on.

* * * * *